United States Patent [19]

Strand et al.

[11] Patent Number: 5,128,099
[45] Date of Patent: Jul. 7, 1992

[54] CONGRUENT STATE CHANGEABLE OPTICAL MEMORY MATERIAL AND DEVICE

[75] Inventors: David A. Strand, West Bloomfield; Stanford R. Ovshinsky, Bloomfield Hills, both of Mich.

[73] Assignee: Energy Conversion Devices, Inc., Troy, Mich.

[21] Appl. No.: 657,170

[22] Filed: Feb. 15, 1991

[51] Int. Cl.$^5$ ............................ C22C 14/00; G11C 13/00
[52] U.S. Cl. ..................................... 420/579; 148/304; 148/403; 365/113
[58] Field of Search ................ 420/579; 148/304, 403; 365/113

[56] References Cited

U.S. PATENT DOCUMENTS

| | | | |
|---|---|---|---|
| 3,816,108 | 6/1974 | Takagi et al. | 420/579 |
| 4,263,573 | 4/1981 | Melton et al. | 148/403 |
| 4,726,858 | 2/1988 | Minemura et al. | 148/300 |
| 4,744,055 | 5/1988 | Hennessey et al. | 365/113 |
| 4,820,394 | 4/1989 | Young et al. | 204/192.26 |
| 4,839,861 | 6/1989 | Ikegawa et al. | 365/113 |
| 4,924,436 | 5/1990 | Strand | 365/113 |
| 4,947,372 | 8/1990 | Koshino et al. | 365/113 |

*Primary Examiner*—Upendra Roy
*Attorney, Agent, or Firm*—Marvin S. Siskind

[57] ABSTRACT

A state changeable memory alloy and device employing same. The memory alloy is capable of changing from a first state to a second state in response to the input of energy, such as projected optical beam energy, electrical energy or thermal energy. The alloy has a first detectable characteristic when in the first state and a second detectable characteristic when in the second state. It is further characterized in that the first state comprises a single phase, and the second state comprises either: (1) a single phase having the same composition as the first phase or (2) a plurality of phases which have substantially similar crystallization temperatures and kinetics.

23 Claims, 5 Drawing Sheets

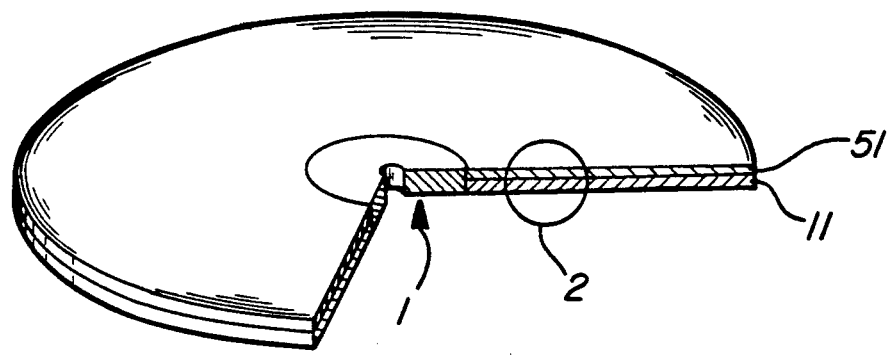
_FIG-1_
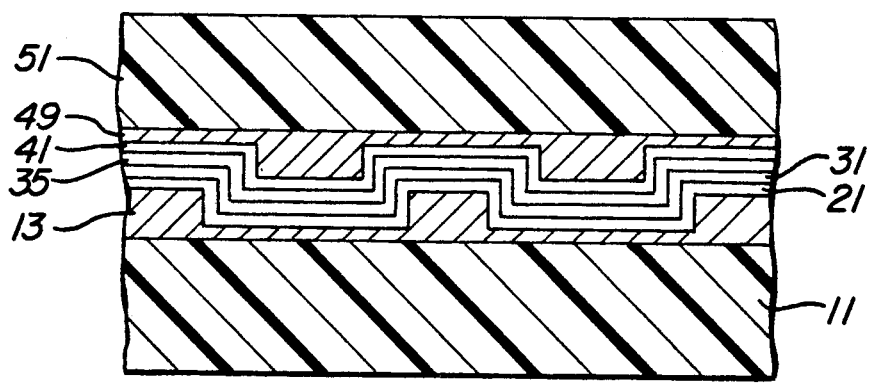
_FIG-2_

CONGRUENT STATE CHANGEABLE OPTICAL MEMORY MATERIAL AND DEVICE

FIELD OF THE INVENTION

The invention disclosed herein relates to data storage devices where data is stored in a material that is reversibly switchable between detectable states in response to the input of energy.

BACKGROUND OF THE INVENTION

Nonablative state changeable data storage systems, for example, optical data storage systems, record information in a state changeable material that is switchable between at least two detectable states by the application of energy such as, for example, projected optical beam energy, electrical energy, or thermal energy, thereto.

State changeable data storage material is typically incorporated in a data storage device having a structure such that the data storage material is supported by a substrate and protected by encapsulants. In the case of optical data storage devices, the encapsulants include, for example, anti-ablation materials and layers, thermal insulation materials and layers, anti-reflection materials and layers, reflective layers, and chemical isolation layers. Moreover, various layers may perform more than one of these functions. For example, anti-reflection layers may also be anti-ablation layers and thermal insulating layers. The thicknesses of the layers, including the layer of state changeable data storage material, are engineered to minimize the energy necessary for effecting the state change and to optimize the high contrast ratio, high carrier to noise to ratio, and high stability of state changeable data storage materials.

The state changeable material is a material capable of being switched from one detectable state to another detectable state or states by the application of, for example, projected beam energy, electrical energy, or thermal energy thereto. The detectable states of state changeable materials may differ in their morphology, surface topography, relative degree of order, relative degree of disorder, electrical properties, optical properties, including indices of refraction and reflectivity, or combinations of one or more of the foregoing. The state of the state changeable material is detectable by properties such as, for example, the electrical conductivity, electrical resistivity, optical transmissivity, optical absorption, optical refraction, optical reflectivity, or combinations thereof. That is, the magnitude of the detectable property will vary in a predictable manner as the state changeable material changes state.

Formation of the data storage device includes deposition of the individual layers by, for example, evaporative deposition, chemical vapor deposition, and/or plasma deposition. As used herein plasma deposition includes sputtering, glow discharge, and plasma assisted chemical vapor deposition.

Tellurium based materials have been utilized as state changeable materials for data storage where the state change is a structural change evidenced by a change in a physical property such as reflectivity. This effect is described, for example, in J. Feinleib, J. deNeufville, S. C. Moss, and S. R. Ovshinsky, "Rapid Reversible Light-Induced Crystallization of Amorphous Semiconductors," *Appl. Phys. Lett.*, Vol. 18(6), pages 254–257 (Mar. 15, 1971), and in U.S. Pat. No. 3,530,441 to S. R. Ovshinsky for *Method and Apparatus For Storing And Retrieving Of Information*.

Tellurium based state changeable materials, in general, are single or multi-phased systems and: (1) the ordering phenomena include a nucleation and growth process (including both or either homogeneous and heterogeneous nucleations) to convert a system of disordered materials to a system of ordered and disordered materials; and (2) the vitrification phenomena include melting and rapid quenching of the phase changeable material to transform a system of disordered and ordered materials to a system of largely disordered materials. The above phase changes and separations occur over relatively small distances, with intimate interlocking of the phases and gross structural discrimination, and are highly sensitive to local variations in stoichiometry.

In chalcogenide type memory materials, the measures of performance include (1) the contrast ratio, that is, the difference in reflectivities of the states divided by the sums of the reflectivities of the states, and (2) the carrier to noise ratios of both (a) the "written" and (b) the "erased" states. The failure mode of the memory material is evidenced by the deterioration in the measures of performance with respect to the number of cycles. That is, failure may be evidenced by for example (1) a reduction in contrast ratio with increasing cycles, or by (2) a reduction in the written carrier to noise ratio or an increase in the erased carrier to noise ratio.

If the memory material is to be used as a "write once" medium, it is highly desirable that it have a relatively high glass transition temperature since this gives it good thermal stability over the life of the recording medium. Since, in many cases, it is customary to write or record onto a medium which is already in an amorphous first state by switching it to crystalline second state, the integrity of the recording depends on the ability of the amorphous second state to resist spontaneous or accidental crystallization into the written state. The higher the glass transition temperature of the recording medium is, the more likely the medium will resist undesirable crystallization when in the amorphous state, particularly when the recorded region consists of all alternating regions of recorded crystalline spots and unaltered amorphous species between. Of course, the crystallization temperature must not be so high or that recording sensitivity suffers.

In addition to write once materials, optical data storage systems may also employ erasable material which may be recorded upon, erased, rerecorded upon, reerased, etc. In this case, the phase changeable material must reversibly be able to change from the amorphous to the crystalline state, and back again, repeatedly. For erasable materials, additional considerations are important. Most significantly, through repeated cycle life (repeated vitrification and crystallization), prior art materials have shown a tendency to degrade over time. It is thought that important factors contributing to this degradation over cycle life are the tendency for inhomogeneities and inclusions to appear in the material. That is, after the material crystallizes and recrystallizes, regions of variable structure and composition may appear therein which were not present in the original material. Due to the thermal history of the material, the various components of which it is composed may selectively migrate, chemically bond, or substitute for other components in the crystal lattice. Moreover, some of the material may not properly vitrify, thus creating undesirable crystalline or noncrystalline inclusions. All of these factors can result in degraded performance.

These problems become particularly acute in typical tellurium based materials, such as tellurium-antimony-germanium systems because, depending upon the atomic percentages of each individual component within the material, these TAG systems can form a multitude of crystalline and amorphous phases. Thus, even though the as deposited material has a nominal composition of $Te_x Ge_y Sb_z$, the material, in its crystalline state, may comprise a plurality of crystalline phases of varying and unpredictable composition. That is, one crystalline phase may have proportionately much more tellurium, another much more germanium, etc. Because of this noncongruency of composition between the amorphous and crystalline states, such materials are prone to degrade over cycle life due to the reasons explained above.

Furthermore, due to the multitude of crystalline phases, switching to the crystalline state includes atomic diffusion and is therefore relatively slow. Thus, switching speed is undesirably slow, and selecting a new composition to improve switching speed may compromise and the thermal stability of the material.

The desirability of congruency in composition between the crystalline and amorphous states has been described with respect to a binary optical memory material in U.S. Pat. Nos. 4,876,667 and 4,924,436, both assigned to assignee of the present invention. Both referenced patents concern themselves with binary chalcogenide data storage material, namely antimony telluride/antimony selenide compositions. As described in the referenced patents, the telluride and the selenide are essentially compositionally congruent between the amorphous and crystalline states. This is so because the telluride/selenide compositions are substantially miscible in substantially all proportions. That is, each crystal has approximately the nominal composition of the as deposited material. This is so largely because, due to their atomic structure and valence characteristics, the tellurides and selenides are capable of substituting for each other in the crystal lattice over a wide range of compositions. However, this is known not to be the case for TeGeSb systems.

The desirability of maintaining compositional congruency while depositing the layer of memory material in tellurium-based memory materials has been recognized. See, for example, U.S. Pat. No. 4,621,032, assigned to the assignee of the present invention. The reference discloses a method of depositing the layer of memory material by a congruent sublimation process wherein the sources or precursor materials are selected so as to maintain consistency in the deposited materials. However, this patent also teaches that there can be phase separation upon crystallization of the amorphous material into a crystalline and amorphous second phase, which phase separation necessarily entails the undesirable consequences noted above.

SUMMARY OF THE INVENTION

Disclosed and claimed herein is a state changeable memory alloy capable of changing from a first state to a second state upon the application thereto of energy, such as, for example, projected optical beam energy, electrical energy, or thermal energy. The alloy has a first detectable characteristic when in said first state and a second detectable characteristic when in said second state. The alloy is further characterized in that the first state comprises a single phase, and the second state comprises either: (1) a single phase having the same composition as the first phase; or (2) a plurality of phases which have substantially similar crystallization temperatures and kinetics. In one exemplification of the memory alloy claimed herein, the alloy comprises a chalcogenide material which may be comprised of a least three elements such as, for example, tellurium, germanium and antimony.

In another embodiment, the memory alloy of the present invention is a chalcogenide, optical memory alloy which exhibits compositional congruency between an amorphous and a crystalline state. The alloy material has a first detectable characteristic (typically, optical reflectivity) when in the amorphous state and a second detectable characteristic when it is in the crystalline state. By using the method in a multilayer thin film optical structure, the direction of reflectivity change can be selected by appropriate choice of the memory material layer and other layer thicknesses. The material is capable of undergoing a congruent state change upon the application of projected beam energy thereto, most particularly, beam energy in the form of a laser beam.

In a write-once system, the material, which is typically amorphous in its as-deposited condition, may be switched typically only once into its crystalline state by a single application of laser light at an energy sufficient to crystallize or initiate crystallization of the material.

In this manner, data is recorded onto the material. Alternatively, the material may be written on by switching it from the crystalline to the amorphous state. In erasable systems, the material must be capable of undergoing repeated switching between one state and another. In order to do this, the material is written on by crystallizing (or vitrifying) it with a laser beam at a first energy, and revitrified (or recrystallized) by erasing it with laser light of a second different energy. See, for example, U.S. Pat. Nos. 4,667,309 and 4,744,055, both assigned to the assignee of the present invention.

The material claimed herein has the following composition:

$Te_a Ge_b Sb_c$ a, b and c being expressed in atomic percentages. A, b and c are selected such that the material maintains compositional congruency between the crystalline and amorphous states. More particularly, when the material is in the crystalline state it includes a major portion which has substantially the same composition as the material has when in the amorphous state and a minor portion which has the following composition:

$Te_d Ge_e Sb_f$ d, e and f again being expressed in atomic percentages. The composition of the minor portion is not too far off the composition of the major portion. More particularly, the difference between a and d, b and e, and c and f total no more than 16 atomic percent. Thus, the amount of any single element in the minor portion can vary from the amount of the same element in the major portion by no more than 8 atomic percent.

A, b and c must be carefully selected in order to maintain the compositional congruency of the alloy between states. In particular, it has been found that compositional congruency is maintained if a is kept between 49 and 53, b is between 36 and 40, and c is between 7 and 11. It is also believed that compositional congruency is maintained when, for example, the following limitations are observed:

| Te 47–53 | Ge 48–43 | Sb 3–7 or |
| Te 47–53 | Ge 31–36 | Sb 15–21 or |
| Te 47–53 | Ge 15–21 | Sb 31–36 |

Also claimed is a data storage memory device utilizing the alloy material described above. The device comprises a substrate, a dielectric first encapsulating layer on the substrate, a memory layer formed of the alloy on the dielectric first encapsulating layer and a dielectric second encapsulating layer atop the memory layer. Optionally it may further include an optically reflective layer, preferably of antimony, between the alloy layer and the second encapsulating layer.

The data storage medium may be formed by depositing the materials to form a substantially uniform deposit thereof. The thickness of the deposit is chosen to give reflectivity and contrast as deemed best by the application.

BRIEF DESCRIPTION OF THE DRAWINGS

This invention may be more particularly understood by reference to the following drawings in which:

FIG. 1 is a partial cut-away isometric view, not to scale, with exaggerated latitudinal dimensions and vertical scale, of an optical data storage device constructed in accord with the teachings of the present invention;

FIG. 2 is a detailed section of a part of the optical data storage device of FIG. 1 showing the relationship of the various layers thereof;

DETAILED DESCRIPTION OF THE INVENTION

Figure 3:
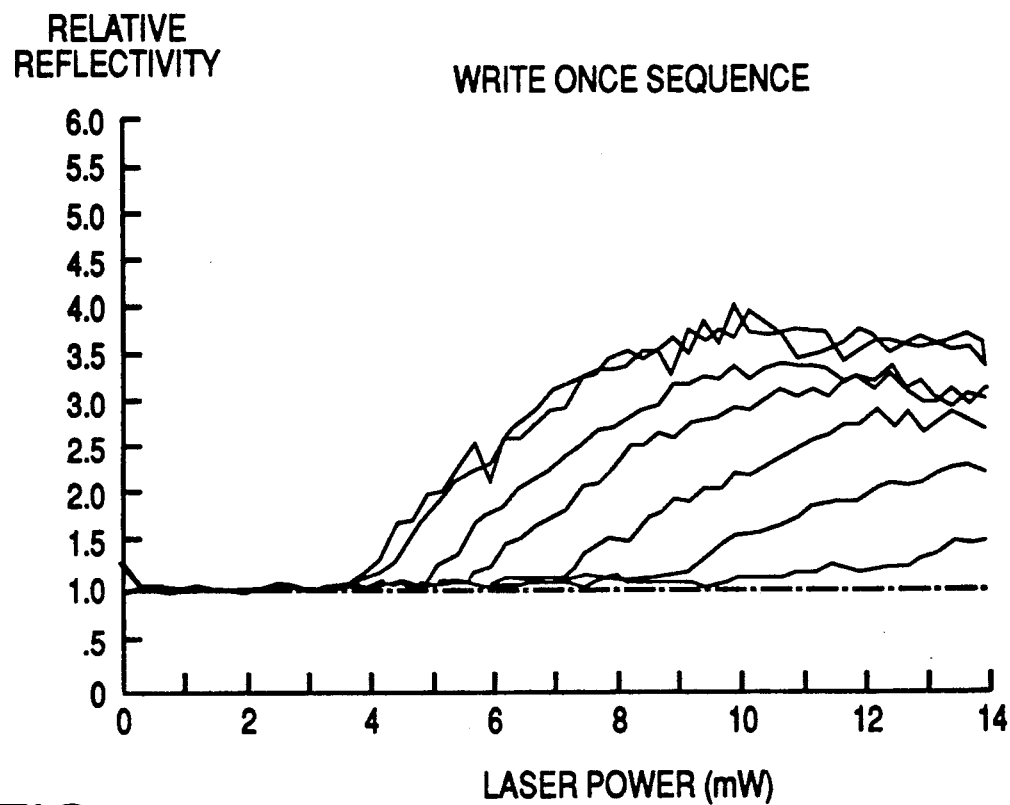
FIG. 3 is a representation of the relative reflectivity obtained by exposure to different laser power at various pulse widths of a material encompassed by the claims of the present invention.

Throughout the following detailed description, like reference numerals are used to refer to the same element shown in multiple figures thereof.

FIGS. 1 and 2 show a projected beam data storage device 1 having a substrate, for example a plastic substrate 11, a first encapsulating dielectric layer 21, for example a first germanium oxide encapsulating layer, a chalcogenide compound data storage medium layer 31, an antimony reflective layer 35, a second dielectric layer e.g., a second germanium oxide layer 41, and a second substrate, e.g., plastic substrate 51.

FIG. 2 shows a section of the data storage device 1 of FIG. 1 in greater detail. As there shown, the substrate 11 is a polymeric sheet, for example a polycarbonate sheet. The substrate 11 is a substantially optically invariant, optically isotropic, transparent sheet. The preferred thickness is of about 1.2 mm.

A top substrate 51 and encapsulant layer 41 is a film, sheet or layer 49, e.g. a photoinitiated polymerized acrylic sheet. Polymerized, molded, injection molded, or cast into the polymeric sheet 11, may be grooves. When grooves are present they may have a thickness from about 500 to about 1000 Angstroms. The film, sheet, or layer 49 may act as an adhesive layer holding the substrate 51 to the encapsulant 41. It has a thickness of from about 1 to about 200 microns and preferably from about 10 to about 100 microns.

Deposited atop the substrate 11 is a dielectric barrier layer 21. A similar dielectric encapsulating layer 41 lies between sheet 49 and optional antimony layer 35. The dielectric barrier layers 21, 41, for example, of germanium oxide, are each from about 500 to about 2000 Angstroms thick. Preferably they have an optical thickness of one-quarter times the laser wavelength times the index of refraction of the material forming the dielectric layers 21 and 41. The dielectric barrier layers 21, 41 have one or more functions. They can serve to optimize reflectivity and/or prevent agents which could chemically change the active layer from getting to the chalcogen active layer 31 and/or prevent the plastic substrates from deforming due to local heating of the chalcogenide layer 31, e.g., during recording or erasing.

Other dielectrics may provide the encapsulating layers 21,41. For example, the encapsulating layers may be silica, alumina, silicon nitride, or other dielectric. The composition of any of these materials may be layered or graded to avoid diffusion into the chalcogenide layer 31.

The chalcogenide compound data storage medium layer 31 is comprised of a congruent state changeable material which is capable of existing in at least an amorphous state and a crystalline state. The material has a first detectable characteristic, such as optical reflectivity, when in the crystalline state, and a second detectable characteristic, again such as optical reflectivity, when in the amorphous state. In one adaptation, the chalcogenide memory layer 31 is used as an anti-reflection coating for the antimony layer 35. The optical constants of the two layers are such that the thickness of the chalcogenide layer is chosen to be very thin (about 300 angstroms) to achieve maximum reflectivity contrast. Because the chalcogenide layer 31 is only partially transmissive, the contribution of the antimony layer 35 to the total reflectivity increases when the chalcogenide layer 31 is thinner, which improves the contrast. The thickness of the antimony layer 35 is not as important, but best results are obtained when it is at least thick enough (also about 300 angstroms) to obtain its maximum reflectivity. When phase change chalcogenide alloy films are used in an anti-reflection optical structure, the direction of reflectivity change can be selected by appropriate choice of the chalcogenide layer thickness. In this case, the layer thickness is selected such that there is a measurable increase in reflectivity after the material has been crystallized. Typically, the reflectivity of the material after recording is 1½ to 3 times that of the unrecorded spot, or even more. The antimony layer 35 also functions as a seed layer to initiate crystallization in the chalcogenide layer 31 when it is switched to the crystallized state. In this way, switching speed is increased.

In general, it has been found that optimum material performance in terms of switching speed is achieved when tellurium comprises approximately 50 atomic percent of the material and germanium together with either antimony, bismuth or tin comprises the remainder. The generic formula for this improved material may be written $Te_{50}(GeX)_{50}$ where X equals Sb, Bi or Sn, it being understood that several percent deviation from the general formula may be tolerated without significant effect.

The Te-Ge system forms a rhombohedral crystalline phase and it is speculated that when the (GeX) component is in an approximate 1:1 ratio with the Te, the crystal structure becomes face centered cubic and reversible, high speed switching is achieved.

In general, some germanium must be present to assure that the desired TeGe phase is developed; however, it has been found that Sb, Sn, Bi and the like may substitute for a significant portion of the Ge while preserving the desired morphology.

One particular class of materials comprise $Te_{50}$-$(GeSb)_{50}$ it has been found that in those instances where the Ge is present in a greater amount than the Sb, the material crystallizes into two phases having similar crystallization temperatures and kinetics. In those instances where the Sb is present in a higher amount than the Ge, crystallization tends to produce one phase. It has been found that the TeSb tends to produce non-equilibrium crystalline phases. In accord with the present invention, it has been found that presence of Ge in the system stabilizes the Te-Sb phase and enables the congruent crystallization of the material from the amorphous state.

The material of chalcogenide layer 31 is capable of undergoing a congruent state change upon the application of projected beam energy such as laser energy thereto. The material is a compound having the composition $Te_aGe_bSb_c$, a, b and c being expressed in atomic percentages and selected such that, when the material is in the crystalline state, the material is substantially crystalline and includes a major crystal phase which has the same composition as the material has when in the amorphous state. The crystalline material may further includes a minor portion which has the composition $Te_d$-$Ge_eSb_f$, d, e and f being expressed in atomic percentages, wherein the differences between a and d, b and e, and c and f respectively total not more than 16 atomic percent.

After experimenting with a range of optical recording film compositions, it has been experimentally determined that, where a is from 49 to 53 atomic percent, b is from 35 to 43 atomic percent and c is from 7 to 11 atomic percent, the compositions exhibit optimum performance when tested for sensitivity, and crystallization temperature, Tx.

FIG. 3 is a representation of the relative reflectivity at different lasers powers of a material encompassed by the claims of the present invention. As shown in FIG. 3, a material having a composition $Te_{53}Ge_{37}Se_{10}$ can exhibit a relative reflectivity between the unrecorded and recorded state of approximately 2.5 when the record laser power is at least 6 or 7 milliwatts. FIG. 3 shows that the threshold record power using a laser pulse width of 100 nanoseconds is 6 to 7 milliwatts. As can be seen, the material of the present invention will switch from a first detectable state to a second detectable state upon the application of a recording laser pulse having a power of 6 to 7 milliwatts in a 100 nanosecond pulse.

Figure 4:
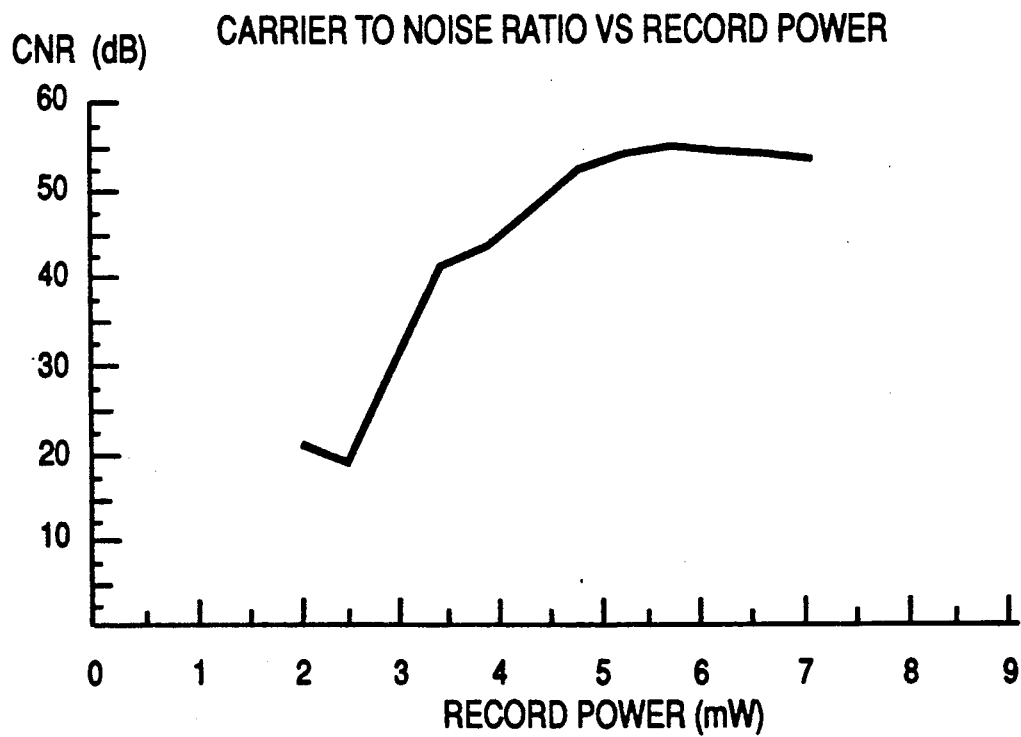
FIG. 4 is a graph showing the plot of the carrier-to-noise ratio versus the laser power used to make a recording on a material encompassed by the claims of the present invention.
Figure 5:
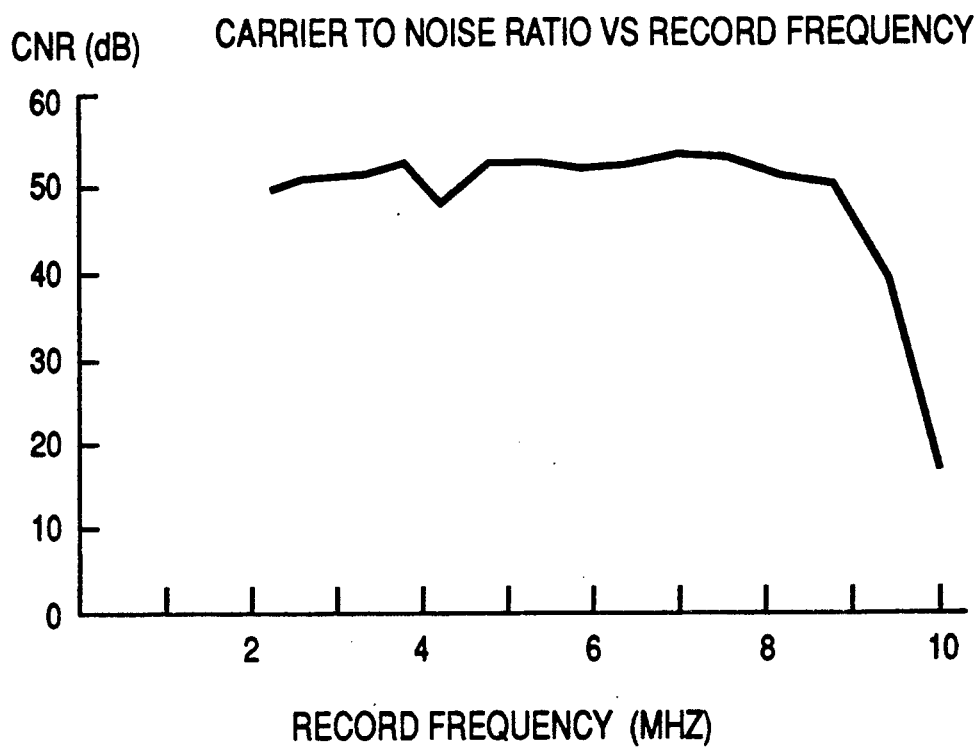
FIG. 5 is a graph with carrier-to-noise ratio plotted versus the record frequency for recordings made on a material encompassed by the claims of the present invention.

FIGS. 4 and 5 are, respectively, graphs showing the plot of carrier to noise ratio versus, respectively, the record power and the record frequency for the $Te_{53}$-$Ge_{37}Se_{10}$ material. A disk coated with this material shows over 53 dB carrier to noise ratio when recorded on at a laser power of 5.5 milliwatts (10 meters per second linear track velocity), as can be seen in FIG. 4.

FIG. 5 shows that this same material has a usable upper frequency of greater than 5 MHz at 10 m/s LTV, corresponding to a bit length of 0.84 microns. Since the frequency during testing was essentially determined by the limits of the optics of the dynamic tester used, it is expected that the fundamental resolution of the material of the present invention may be higher.

The following table shows experimentally determined crystallization temperatures for a range of compositions within the TeGeSb system. In particular, the material having a composition $Te_{53}Ge_{37}Se_{10}$ exhibited a crystallization temperature of 218° C.

TABLE 1

| Sample Number | Composition | | | Tx |
|---|---|---|---|---|
| | Te | Ge | Sb | |
| E-1043 | 25 | 60 | 15 | >250° C. |
| E-1045 | 30 | 55 | 15 | >250° C. |
| E-1036 | 35 | 50 | 15 | >250° C. |
| E-1038 | 40 | 45 | 15 | >250° C. |
| E-1039 | 45 | 40 | 15 | >250° C. |
| E-1051 | 50 | 35 | 15 | 208° C. |
| E-1041 | 55 | 30 | 15 | 181° C. |
| E-1044 | 60 | 25 | 15 | 178° C. |
| E-1046 | 45 | 30 | 25 | 222° C. |
| E-1047 | 47 | 33 | 20 | 222° C. |
| E-1048 | 53 | 37 | 10 | 218° C. |
| E-1049 | 36 | 39 | 5 | 201° C. |

On the basis of the experimental data, it is estimated that the thermal stability of optical films utilizing material of the present invention at 50° C. to be at least several decades.

Figure 6:
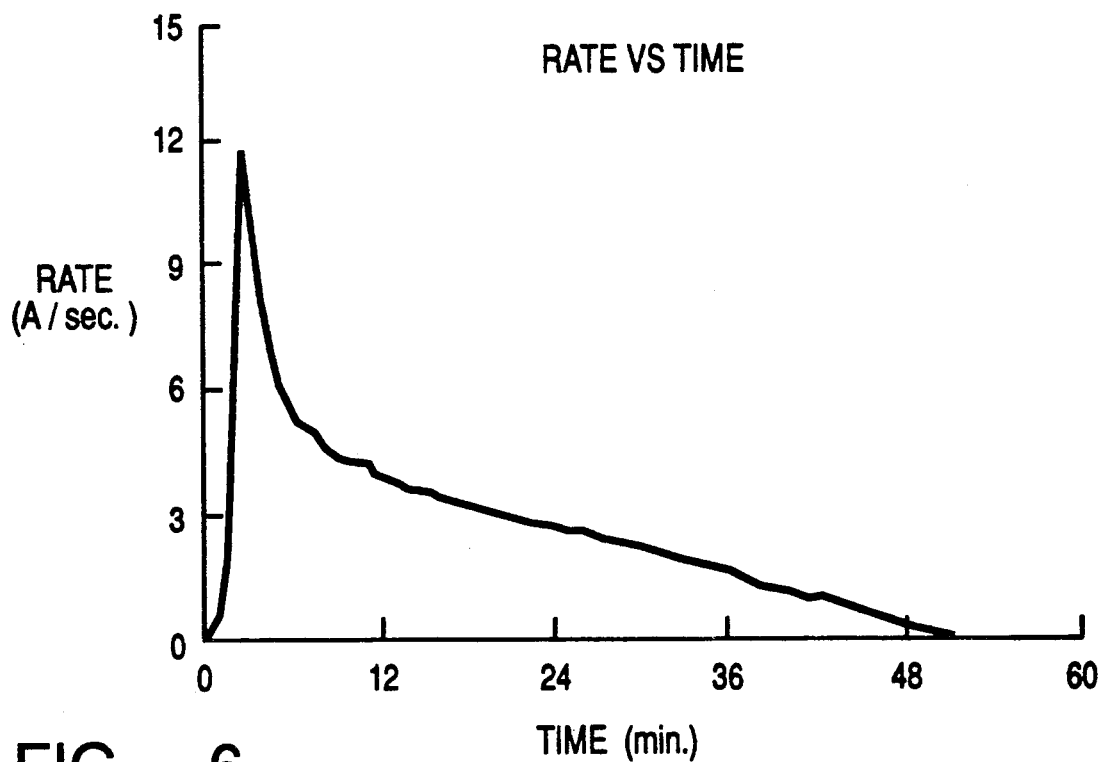
FIG. 6 is a graph showing the rate of deposition of a material encompassed by the claims of the present invention evaporated from a TeGeSb alloy source plotted against time; 15
Figure 7:
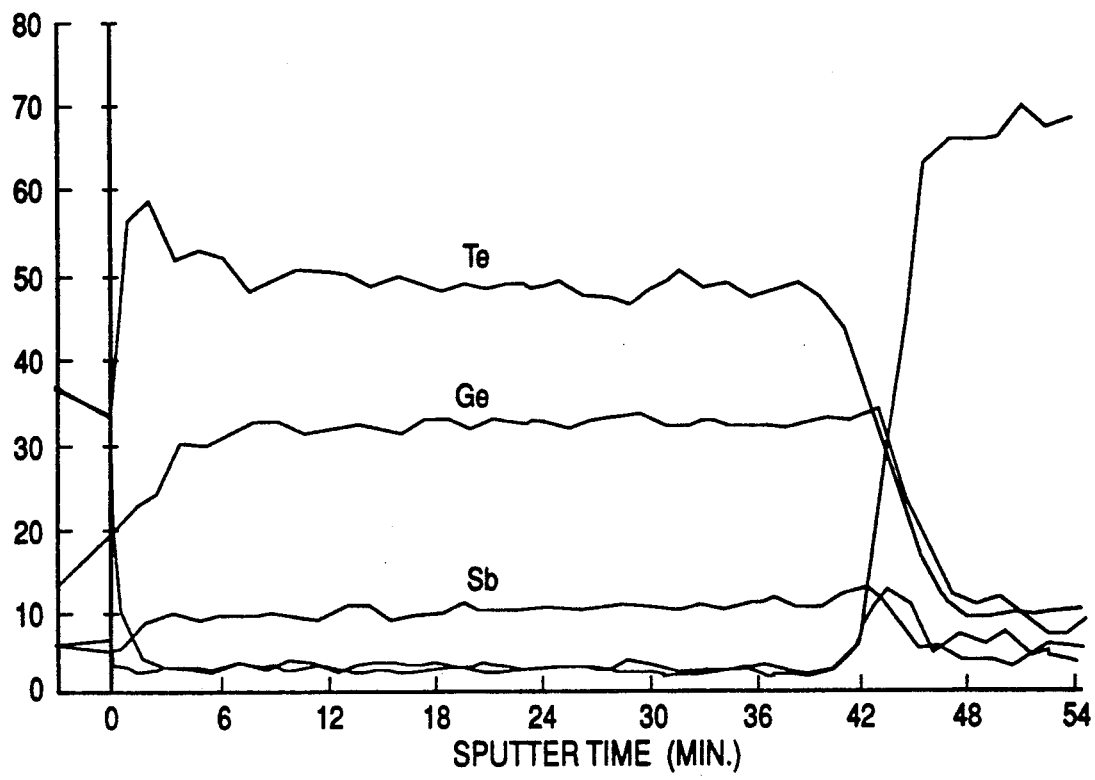
FIG. 7 is a representation of an Auger electron spectroscopy profile of a material encompassed by the claims of the present invention.

Further experiments were conducted to determine the structure of one species of the claimed material. A bulk alloy having a nominal composition of $Te_{51}$-$Ge_{40}Sb_9$ and encompassed by the claims of the present invention was prepared. The bulk alloy was prepared by grinding together appropriate amounts of tellurium, germanium and antimony. This mixture was placed in a quartz ampule, which was subsequently evacuated and sealed. The ampule was heated at 850° C. for 1½ hours, with a rocking motion used for agitation throughout the heating step. The alloy was cooled by a water quench, and the ampule then opened. It was then ground to a particle size of approximately 1/6 of a millimeter. A measured amount of the alloy was deposited by vacuum evaporation using a source temperature of approximately 520° C. The deposition was continued until the material in the deposition crucible was exhausted. As can be seen in FIG. 6, it was found that the deposition rate versus time for this congruently state changeable material is linear, which is a necessary characteristic of a constant-composition sublimation (See U.S. Pat. No. 4,621,032). A silicon wafer was exposed to the evaporant stream during the deposition. FIG. 7 is an Auger electron spectroscopy profile which confirms that the composition of the deposited material is constant throughout the deposition.

Figure 8:
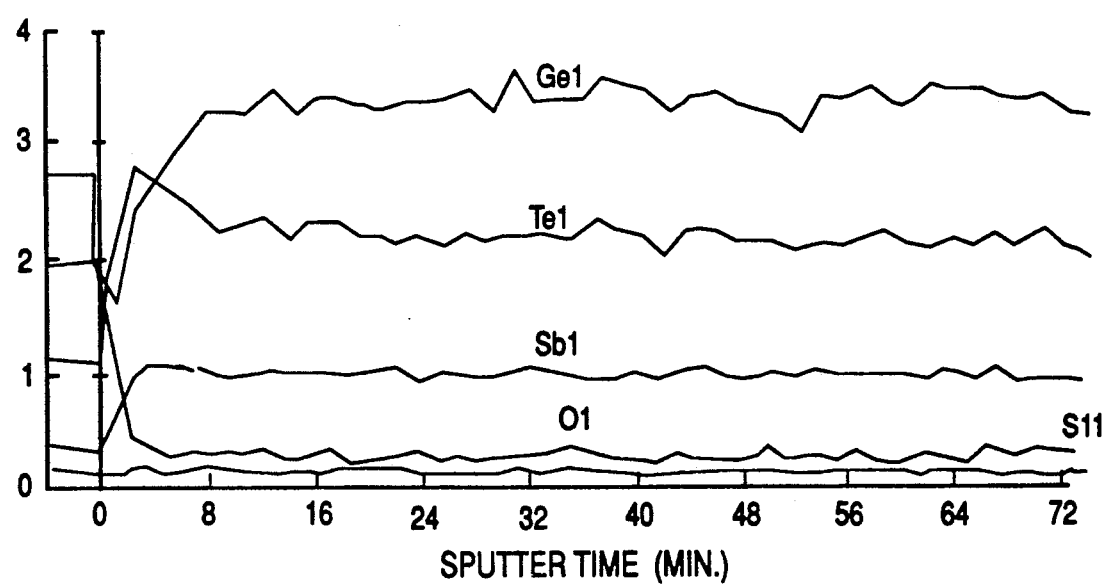
FIG. 8 is another Auger electron spectroscopy profile of another material encompassed by the claims of the invention.
Figure 9:
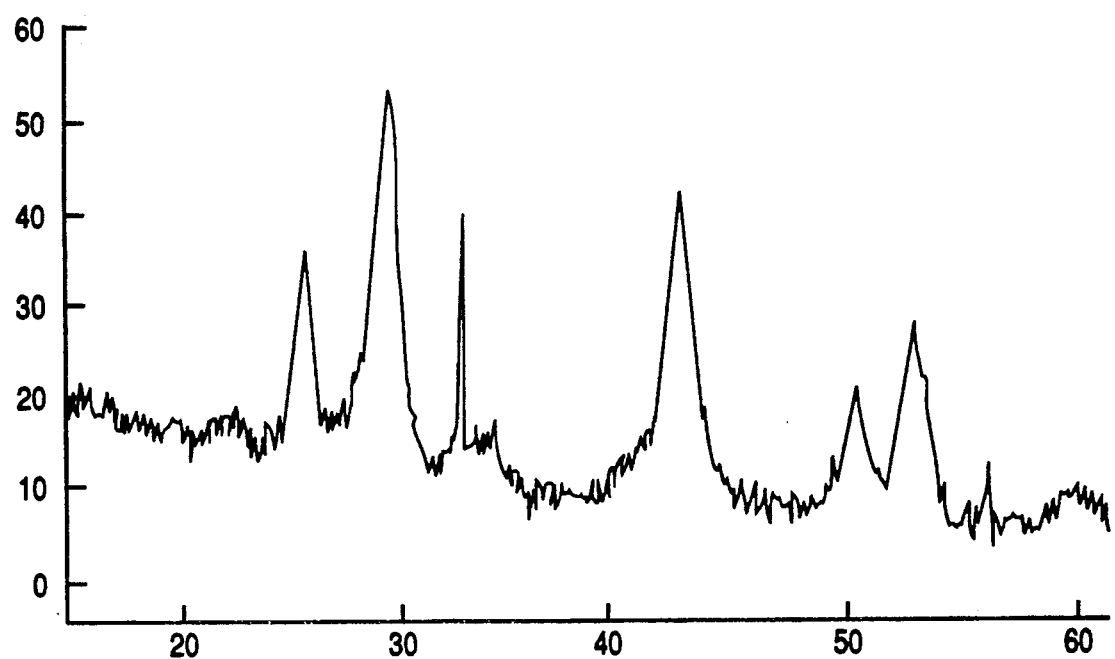
FIG. 9 is a representation of an x-ray diffraction spectroscopy profile of the material of FIG. 8.

The bulk alloy described above has two phases, as revealed by x-ray diffraction studies and electron dispersive spectroscopy. The major phase has a composition of $Te_{52}Ge_{37}Sb_{11}$, which can be considered, within experimental error, to be the same composition as that of the bulk alloy. Also present is a second, minor phase having a nominal composition $Te_{51}Ge_{44}Sb_5$. The two phases have substantially similar crystallization temperatures and kinetics. The results of Auger electron spectroscopy and electron dispersive spectroscopy for the major phase of the material are shown, respectively, in FIGS. 8 and 9. Auger electron spectroscopy is a particular useful analytical tool for thin films deposited from a bulk source. Because of its depth profile and capabilities, it is possible to determine the composition of a film as it is being eroded away by ion milling. Thus, not only can the composition of the film be determined, but it can be seen how the composition changes over the depth of the film. As can be seen from FIG. 8, beyond the first few tens of angstroms ( which reflects contaminants that are introduced to the surface during normal sampling handling and storage), the composition of the film remains remarkedly consistent over the entire depth thereof.

It is believed that there are other distinct compositions within the TAG ternary system that form crystals including all three elements and having a composition similar to the composition of the bulk material. For example, the following composition will consistently crystallize from materials having elemental ratios of Te:Ge:Sb in this vicinity:

| Te 51 | Ge 44 | Sb 5 |
| Te 51 | Ge 32 | Sb 17 |
| Te 51 | Ge 17 | Sb 32 |

Again, it is expected that materials of this composition will exhibit superior performance characteristics.

It is, of course, possible that other ratios of the elements within the TAG ternary system may meet the limitations of the claims appended hereto. Furthermore, while the present invention has been described with respect to optical memory systems, it is not limited to such systems; rather, it also finds application in any system where energy is applied to change the state of the material in a predictable manner. Specifically, the memory material of the present invention may be utilized in a system wherein electrical energy or thermal energy is applied to the material to effect the state change. While the invention has been described with reference to a particular exemplifications and embodiments thereof, it is not intended to be limited to the exemplification and embodiments described. Rather, it is the claims appended hereto and all reasonable equivalents thereof which define the true scope of the present invention.

We claim:

1. A state changeable memory alloy changeable from a first state to a second state in response to the input of energy, said alloy having a first detectable characteristic when in said first state and a second detectable characteristic when in said second state, and said first and second detectable characteristics selected from the group consisting of reflectivity, band gap, electrical resistance, optical absorption, magnetic susceptibility and thermal conductivity;

said alloy further characterized in that the first state comprises a single phase and said second state comprises either (1) a single phase having the same composition as said first state or (2) a plurality of phases which have substantially similar crystallization temperatures and kinetics.

2. An alloy as in claim 1, which comprises a chalcogenide material.

3. An alloy as in claim 1, which comprises at least three elements.

4. An alloy as in claim 1 which comprises Te, Ge and Sb.

5. An alloy as in claim 1 which is capable of changing from said first state to said second state in response to the input of optical energy.

6. An alloy as in claim 1, which is capable of changing from said first state to said second state in response to the input of electrical energy.

7. An alloy as in claim 1, which is capable of changing from said first state to said second state in response to the input of thermal energy.

8. An alloy as in claim 1, wherein said first state is an amorphous state and said second state is a crystalline state.

9. The material of claim 1 wherein said material is substantially entirely crystalline when in said crystalline state.

10. A congruent state changeable, chalcogenide, optical memory material capable of existing in at least an amorphous state and a crystalline state, said material having a first detectable physical characteristic or properties index when in the crystalline state and a second detectable physical characteristic or properties index when in the amorphous state and being capable of undergoing a congruent state change upon the application of projected beam energy thereto, said material being of the composition:

$$Te_aGe_bSb_c$$

a, b and c being expressed in atomic percentages and selected such that, when said material is in the crystalline state, and it includes a major portion which has the same composition as the material has when in the amorphous state and a minor portion which has the composition:

$$Te_dGe_eSb_f,$$

d, e and f being expressed in atomic percentages wherein the differences between a and d, b and e, and c and f, respectively, total no more than 16 atomic percent.

11. The material of claim 10 wherein a is from 49 to 53, b is from 36 to 40 and c is from 9 to 13.

12. The material of claim 10 further comprising a third portion of varying composition.

13. The material of claim 10 wherein the material switches from the amorphous to the crystalline state upon the application of projected beam energy thereto.

14. The material of claim 10 wherein the congruent state change temperature is at least 200° C.

15. The material of claim 13 wherein data is recorded upon the material by switching it from the amorphous to the crystalline state.

16. The material of claim 13 wherein the material is reversibly switchable between the amorphous and crystalline states by application of projected beam energy thereto.

17. The material of claim 15 wherein the material has a usable upper frequency of at least 6 MhZ.

18. The material of claim 16 wherein data is recorded upon the material by switching it from the amorphous to the crystalline state and erased from the material by switching it from the crystalline to the amorphous state.

19. The material of claim 18 wherein the projected beam energy is supplied by a laser.

20. The material of claim 19 wherein the first detectable property is the optical reflectivity of the material in the amorphous state and the second detectable property is the optical reflectivity of the material in the crystalline state.

21. The material of claim 20 wherein the ratio between the first and second detectable states (relative reflectivity) at the threshold record laser power is between 2 and 3.

22. The material of claim 21 wherein the carrier to noise ratio is at least 45 db at the threshold record power.

23. A state changeable memory alloy changeable from a first state to a second state in response to the input of energy, said alloy having a first detectable physical characteristic or properties index when in said first state and a second detectable physical characteristic or properties index when in said second state, said alloy having the general formula $Te_{50}(GeX)_{50}$ wherein X is Sb, Sn or Bi, said alloy further characterized in that the first state comprises a single phase and said second state comprises either (1) a single phase having the same composition as said first state or (2) a plurality of phases which have substantially similar crystallization temperatures and kinetics.

* * * * *

(12) EX PARTE REEXAMINATION CERTIFICATE (9286th)
United States Patent
Strand et al.

(10) Number: US 5,128,099 C1
(45) Certificate Issued: Sep. 11, 2012

(54) CONGRUENT STATE CHANGEABLE OPTICAL MEMORY MATERIAL AND DEVICE

(75) Inventors: David A. Strand, West Bloomfield, MI (US); Stanford R. Ovshinsky, Bloomfield Hills, MI (US)

(73) Assignee: Optical Memory Storage LLC, Newport Beach, CA (US)

Reexamination Request:
No. 90/012,055, Dec. 16, 2011

Reexamination Certificate for:
| | |
|---|---|
| Patent No.: | 5,128,099 |
| Issued: | Jul. 7, 1992 |
| Appl. No.: | 07/657,170 |
| Filed: | Feb. 15, 1991 |

(51) Int. Cl.
| | |
|---|---|
| *G11C 13/04* | (2006.01) |
| *G11C 7/00* | (2006.01) |
| *G11B 7/0055* | (2006.01) |
| *G11B 7/00* | (2006.01) |
| *G11B 7/243* | (2006.01) |
| *G11B 7/24* | (2006.01) |

(52) U.S. Cl. .......... 420/579; 148/304; 148/403; 365/113; G9B/7.022; G9B/7.139; G9B/7.142

(58) Field of Classification Search ................ None
See application file for complete search history.

(56) References Cited

To view the complete listing of prior art documents cited during the proceeding for Reexamination Control Number 90/012,055, please refer to the USPTO's public Patent Application Information Retrieval (PAIR) system under the Display References tab.

*Primary Examiner* — James Menefee

(57) ABSTRACT

A state changeable memory alloy and device employing same. The memory alloy is capable of changing from a first state to a second state in response to the input of energy, such as projected optical beam energy, electrical energy or thermal energy. The alloy has a first detectable characteristic when in the first state and a second detectable characteristic when in the second state. It is further characterized in that the first state comprises a single phase, and the second state comprises either: (1) a single phase having the same composition as the first phase or (2) a plurality of phases which have substantially similar crystallization temperatures and kinetics.

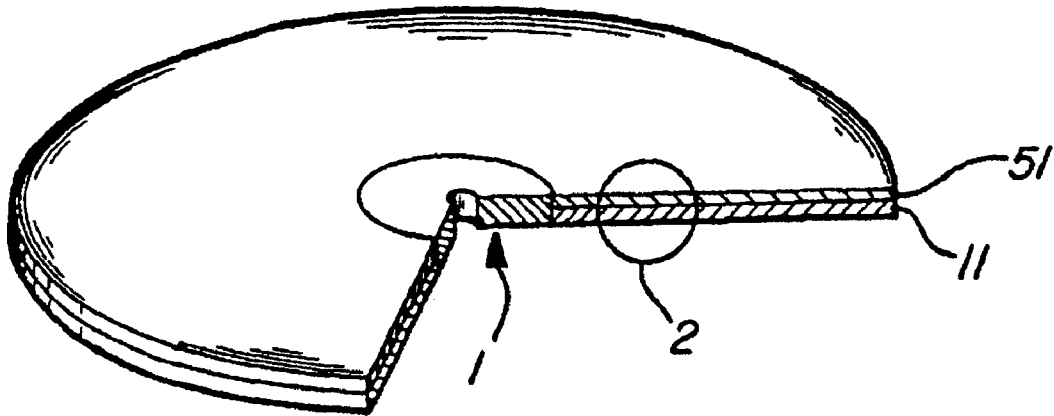

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-9 and 23 are cancelled.
Claims 10-22 were not reexamined.

* * * * *